(12) United States Patent
Andreev et al.

(10) Patent No.: US 7,739,471 B2
(45) Date of Patent: Jun. 15, 2010

(54) HIGH PERFORMANCE TILING FOR RRAM MEMORY

(75) Inventors: Alexander Andreev, San Jose, CA (US); Igor Vikhliantsev, San Jose, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 1269 days.

(21) Appl. No.: 11/256,830

(22) Filed: Oct. 24, 2005

(65) Prior Publication Data

US 2007/0091105 A1  Apr. 26, 2007

(51) Int. Cl.
*G06F 12/02* (2006.01)
(52) U.S. Cl. .................................................. 711/170
(58) Field of Classification Search ........................ None
See application file for complete search history.

(56) References Cited

U.S. PATENT DOCUMENTS 7,219,325 B1 * 5/2007 Lysaght ........................ 716/16

* cited by examiner

*Primary Examiner*—Kevin Verbrugge
(74) *Attorney, Agent, or Firm*—Luedeka, Neely & Graham, P.C.

(57) ABSTRACT

A method of configuring a random access memory matrix containing partially configured memories in the matrix. The method includes the steps of independently calculating a memory enable signal and a configuration signal for a partially configured memory in each memory tile of the memory matrix. Memory tiles not supported by a memory compiler are determined. A memory wrapper is provided for each tile not supported by the memory compiler. An address controller is inserted in the memory matrix for each tile in a group of tiles. Output signals from each memory location in a memory group having a common group index are combined into a single output signal. A first stripe of memory tiles containing non-configured memory having a first width is selected. A second strip of memory tiles containing configured memory having a second width is also selected.

7 Claims, 3 Drawing Sheets

HIGH PERFORMANCE TILING FOR RRAM MEMORY

FIELD

This invention relates to the field of integrated circuit fabrication. More particularly, this invention relates to a method for configuring partially configured memories for integrated circuits.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. One aspect of such a customizable integrated circuit design is referred to as RRAM.

RRAM (Reconfigurable RAM) contains sets of memories of the same type that are placed compactly within a memory matrix. An RRAM, as the term is used herein, is a megacell that can be considered as a set of memories with built-in self testing and built-in self correction. RRAM also contains sets of embedded tools that are used for mapping arbitrary logical customer memory designs to the physical memories in the matrix.

Each RRAM design typically contains several RRAMs. At the stage of memory placement during the design process, memories of the customer's netlist are mapped to the customizable standardized memories of the RRAMs. Then the RRAM megacells are configured in accordance with the resulting memory mapping. The configured RRAM is called a tiling netlist. If the RRAM contains partially configured memories, high performance tiling of the RRAM is problematic.

What is needed, therefore, is an efficient method for tiling any arbitrary customer memory into a group of basic memories when the customer memories contain partially configured memories without unduly increasing the size of the configuration matrix.

SUMMARY

The above and other needs are met by a method of configuring a random access memory matrix containing partially configured memories in the matrix. The method includes the steps of independently calculating a memory enable signal and a configuration signal for a partially configured memory in each memory tile of the memory matrix. Memory tiles not supported by a memory compiler are determined. A memory wrapper is provided for each tile not supported by the memory compiler. An address controller is inserted in the memory matrix for each tile in a group of tiles. Output signals from each memory location in a memory group having a common group index are combined into a single output signal. A first stripe of memory tiles containing non-configured memory having a first width is selected. A second strip of memory tiles containing configured memory having a second width is also selected.

In another embodiment, there is provided a tool for configuring RRAM memory containing partially configured memory. The tool includes a memory wrapper for a group of memories containing a predetermined memory tile. An address controller is provided for calculating a memory enable signal and a configuration signal for inputs to the partially configured memory. A vertical OR block is used for combining output signals from non-configured memories having a common index in a memory group into a single output signal. A configured OR block is included for combining configured memory signals into a single signal for each configured memory output signal.

An advantage of the embodiments of the invention is that partially configured memory may be tiled into a group of basic memories using a single memory mapping matrix. Accordingly, the invention may be used on a wide variety of memory chips to provide a predetermined memory configuration.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

There are the same basic memories for each matrix. "The same" means here that memories have the same type, the same number of bits, and the same capacity. Basic memories within an integrated circuit are preferably organized in matrices of rows and columns. A customer's memory designs may include memories with various parameters. Mapping of the memories from the customer's designs to matrices with timing optimization is a different topic from that as described herein, and is not described in the present disclosure. The preferred embodiments of the present invention describe how any arbitrary customer memory can be tiled to a collection of basic memories from one matrix in an integrated circuit, after mapping has already been accomplished.

For the purposes of this disclosure, high performance tiling of the collection of basic memories may use at most four input pins and the number of tiles in any one group of tiles may not exceed sixteen. Layout placement and wire routing are not the subject of this disclosure.

Figure 1:
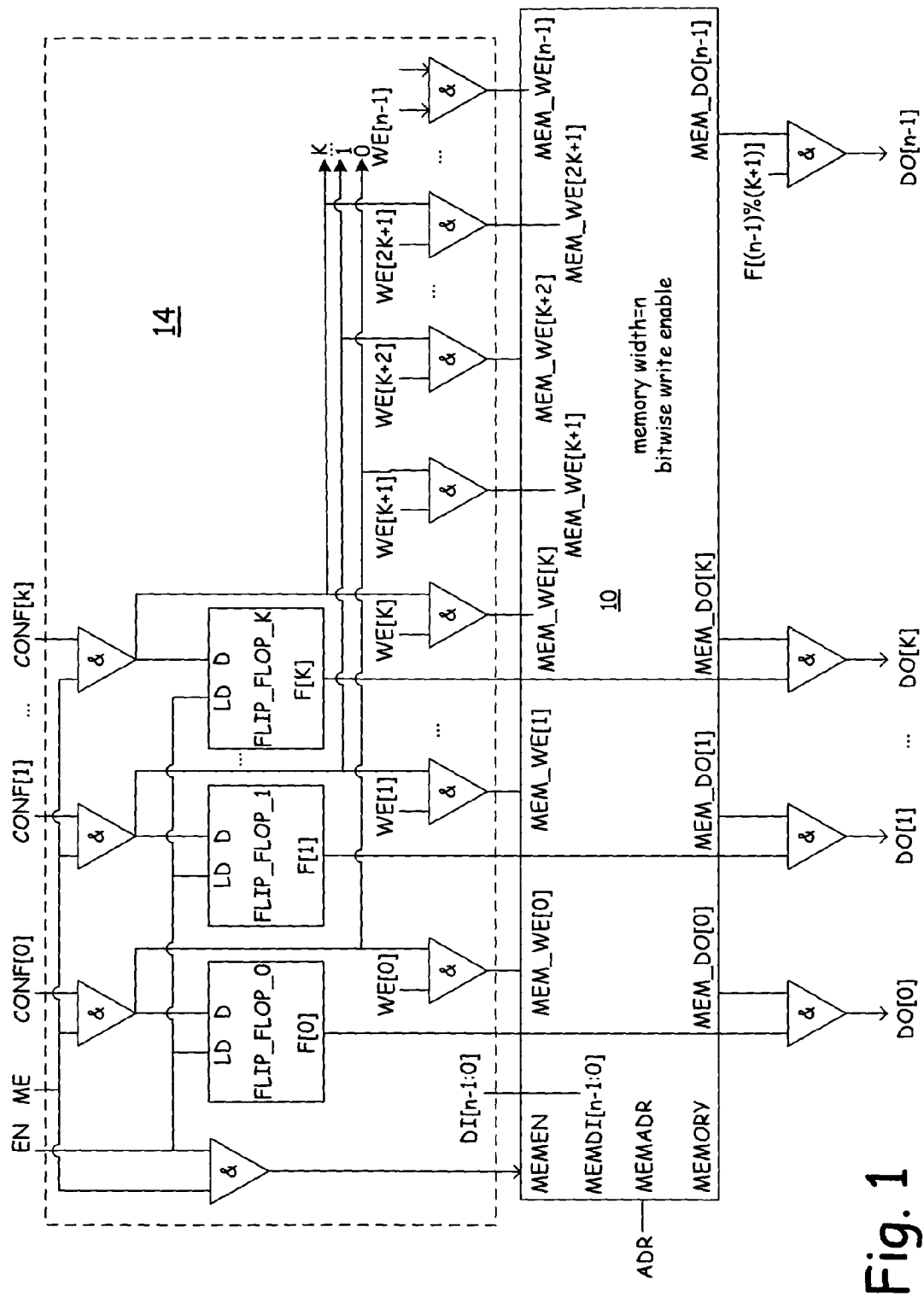
FIG. 1 is a schematic diagram of a memory wrapper for configuring a memory tile.
Figure 2:
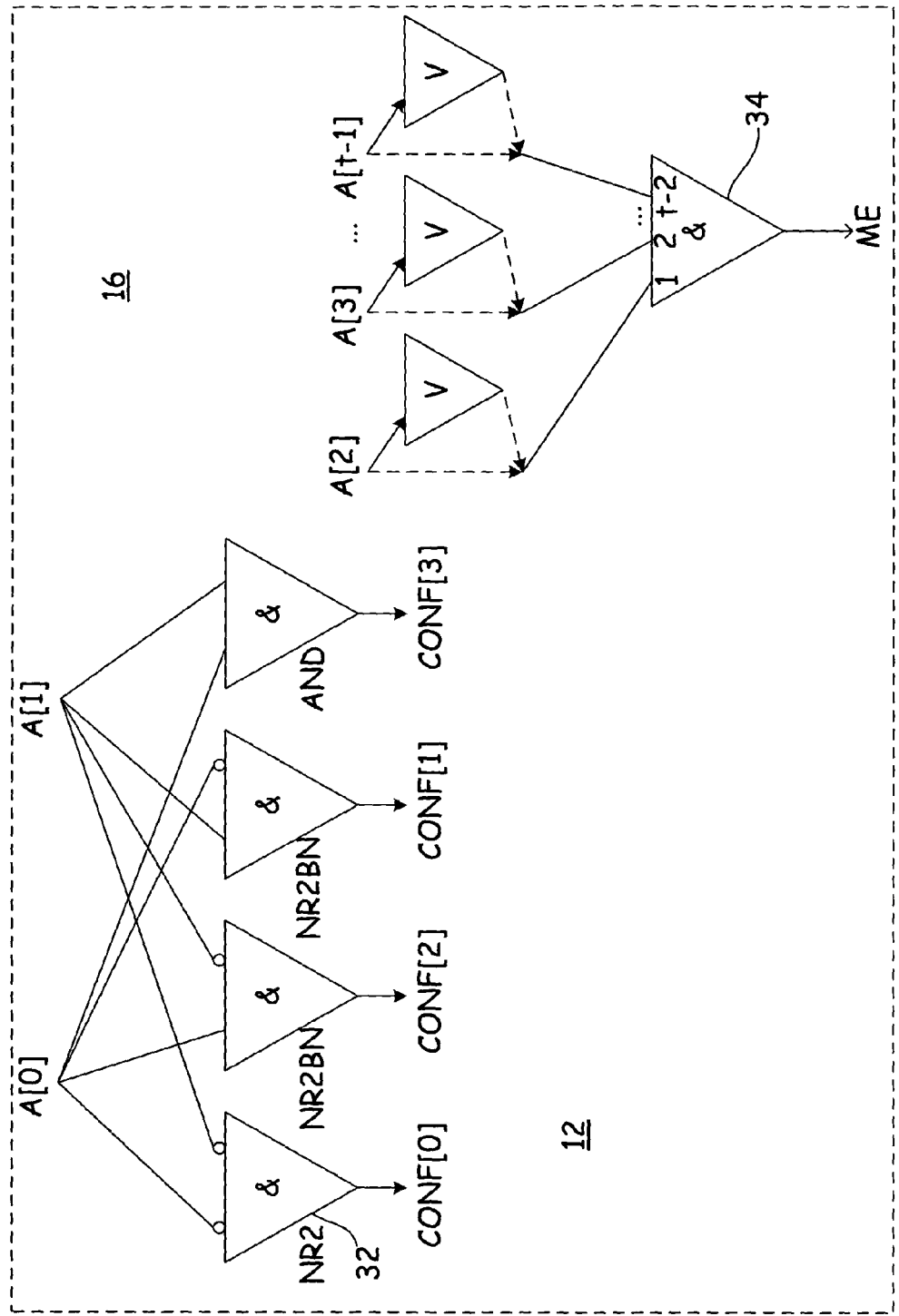
FIG. 2 is a schematic diagram of an address controller for inputting memory enable signals into a memory.

With reference to FIGS. 1 and 2, the regular input and output ports of a partially configured memory 10 and address controller 12 include the following: address bus(es) A, write enable bus(es) WE, enable bit(s) EN, data input bus(es) DI, data output bus(es) DO, and additional inputs: memory enable(s) ME and configuration bus(es) CONF. The memory 10 is a bitwise writeable memory having a memory width of n. In the figures, the prefix "MEM" is used to indicate associated memory ports. For example MEM_EN is used to designate an enable bit for the memory.

As shown in FIG. 1, the partially configured memory 10 operates as follows: if EN=0 then the memory is disabled (MEM_EN=0) and DO=MEM_DO. If EN=1 and ME=0 then the memory is disabled (MEM_EN=0) and DO=0. If EN=1 and ME=1 then memory is enabled (MEM_EN=1) and DO depends from delayed configuration inputs CONF(i). If j % conf_numb=i and CONF[i]=0 then MEM_WE[j]=0 and DO[j]=0. If j % conf_numb=i and CONF[i]=1 then MEM_WE[j]=WE[j] and DO[j]=MEM_DO[j]. If the current memory compiler does not support the foregoing features, then a memory wrapper 14 is used for configuring the memory 10 as shown on FIG. 1.

The memory enable (ME) inputs and the configuration inputs (CONF(i)) are independently determined by an address controller 16 (FIG. 2). The memory enable and configuration inputs are then used as inputs for the partially configured memory 10 using the memory wrapper 14. The following parameters are used to determine the memory enable and configuration inputs: conf_numb, index_in_group, group_size, where conf_numb—is the number of configuration pins for a tile that can be used, hence conf_numb$\leq$2 since there are only four input pins available; group_size is the size of a group of tiles wherein 1$\leq$group_size$\leq$16 since the maximum number of tiles in a group is 16 as set forth above; and index_in_group is the index of a tile inside of a group of tiles wherein 0$\leq$index_in_group$\leq$group_size−1.

Given the above definitions the following formulas are used to determine the configuration input and memory enable input:

$$\mathrm{CONF}[i] = A^{\sigma 0}[0] \& A^{\sigma 1}[1] \& \ldots \& A^{\sigma s}[s], i=0, \ldots, \mathrm{conf\_numb}-1,$$

$$\mathrm{ME} = A^{\sigma(s+1)}[s+1] \& \ldots \& A^{\sigma t}[t-1],$$

where ($\sigma$s, ..., $\sigma$0) are binary representations of integer i, s is the $\log_2$ conf_numb, ($\sigma$(t−1), ..., $\sigma$(s+1)) are binary representations of index_in_group, A[i]–i-th address input of the address controller 16, $x^\sigma$=x if $\sigma$=1 and $x^\sigma$=−x if $\sigma$=0, t is total number of address bits used for coding of the configuration and group indexation and t=$\log_2$ conf_numb+$\log_2$ group_size.

The address controller 16 is used for tiling a group 18, 20, and 22 of tiles (FIG. 3) in a first stripe 24 of customer memory. Likewise, a second address controller 26 is used for tiling a second stripe 28 of customer memory. Each group of memory 18, 20, and 22 represents only one tile. Accordingly, the RRAM memory 10 includes an address controller 16 and 26 for each stripe 24 and 28 of tiles.

For example, tiling a customer memory with a capacity 128K into an RRAM memory 10, where each group 18, 20, 22, and 30 of tiles have the capacity 2K (1K means 1024 words), the number t of address bits that may be used for the address controller is equal to:

$$t = 6 = \log_2(128/2).$$

Accordingly, 2 bits may be used for configuration (with a compression of 4 times) and 4 bits may be used for coding the tile index inside of the group 18, 20, 22 and 30 since the group size is limited to less than or equal to sixteen. Instead of using NEG-gates and AND-gates in the configuration circuit of the address controller 16 or 26, appropriate NOR-gates 32 (FIG. 2) (NR4 or NR4 with negations on inputs—NR4DN, NR4CDN, NR4BCDN) are used. For configuration of a circuit without negation, an AND-gate 34 is used.

"Vertical OR" blocks may be used to combine output signals from the basic memories in stripe 24 with the same indexes from the same memory group into a single signal where:

$$\mathrm{OUT} = \mathrm{INP\_0} \vee \mathrm{INP\_1} \vee \mathrm{INP\_2} \vee \ldots \vee \mathrm{INP}\{\mathrm{group\_size}-1\}.$$

Likewise vertical OR blocks may be used to combine output signals from the memories in stripe 28. All disjunctions are realized from NOR- and NAND-gates for high performance purposes.

"Configured OR" blocks 36, 38, 40, 42, and 44 may be used to combine configured signals from the memories in the first and second stripes 24 and 28 into a single signal for each memory output. The number of the address pins that are used for configuration in the address controllers 16 and 26 is denoted by conf_numb. In the high performance circuit we limited the number of configuration pins to four, hence conf_numb$\leq$2. For conf_numb=0 we just put input to one output through a buffer 46. For conf_numb=1 we combine two inputs into one disjunction. For conf_numb=2 we combine four inputs into one disjunction in vertical OR blocks 42 and 44. Hence the output is represented by the following formula:

$$\mathrm{OUT} = \mathrm{INP\_0} \vee \ldots \vee \mathrm{INP}\_\{2^{conf\_numb}-1\}.$$

All disjunctions must be realized from the NOR- and NAND-gates for high performance purposes.

By way of a further example, assume a tile has the capacity tile_cap and data width mem_width where the tile_cap=$2^l$ for some l and the mem_width is a multiple of 4, i.e. mem_width=4·w for some w. As set forth above, the conf_numb is the number of address pins that are used for configuration in the address controller 16 or 26. In the high performance circuit, the number of configuration pins was limited to four, accordingly, conf_numb$\leq$2. Given a customer memory with a capacity cust_cap and a data width cust_width the memory is configured according to the following steps:

(1) The data width cust_width is cut into stripes with each stripe having a width stripe_width wherein:
   a) stripe_width=mem_width if 0<cust_cap$\leq$16·mem_cap (for conf_numb=0);
   b) stripe_width=mem_width/2 if 16·mem_cap<cust_cap$\leq$32·mem_cap (for conf_numb=1);
   c) stripe_width=mem_width/4 if 32·mem_cap<cust_cap$\leq$64·mem_cap (for conf_numb=2); and
   d) the last stripe stripe_width is equal to the remaining memory width wherein:
      (i) If mem_width/2<stripe_width$\leq$mem_width then conf_numb=0;
      (ii) If mem_width/4<stripe_width$\leq$mem_width/2 then conf_numb=1; and
      (iii) If stripe_width$\leq$mem_width/4 then conf_numb=2.
(2) For each memory group all outputs of the partially configured memories are combined into disjunctions (VERT_OR blocks).
(3) Finally, the configured outputs from VERT_OR blocks are combined into a single signal (CONF_OR blocks). Outputs of CONF_OR blocks are the actual outputs of the configured memories.

Figure 3:
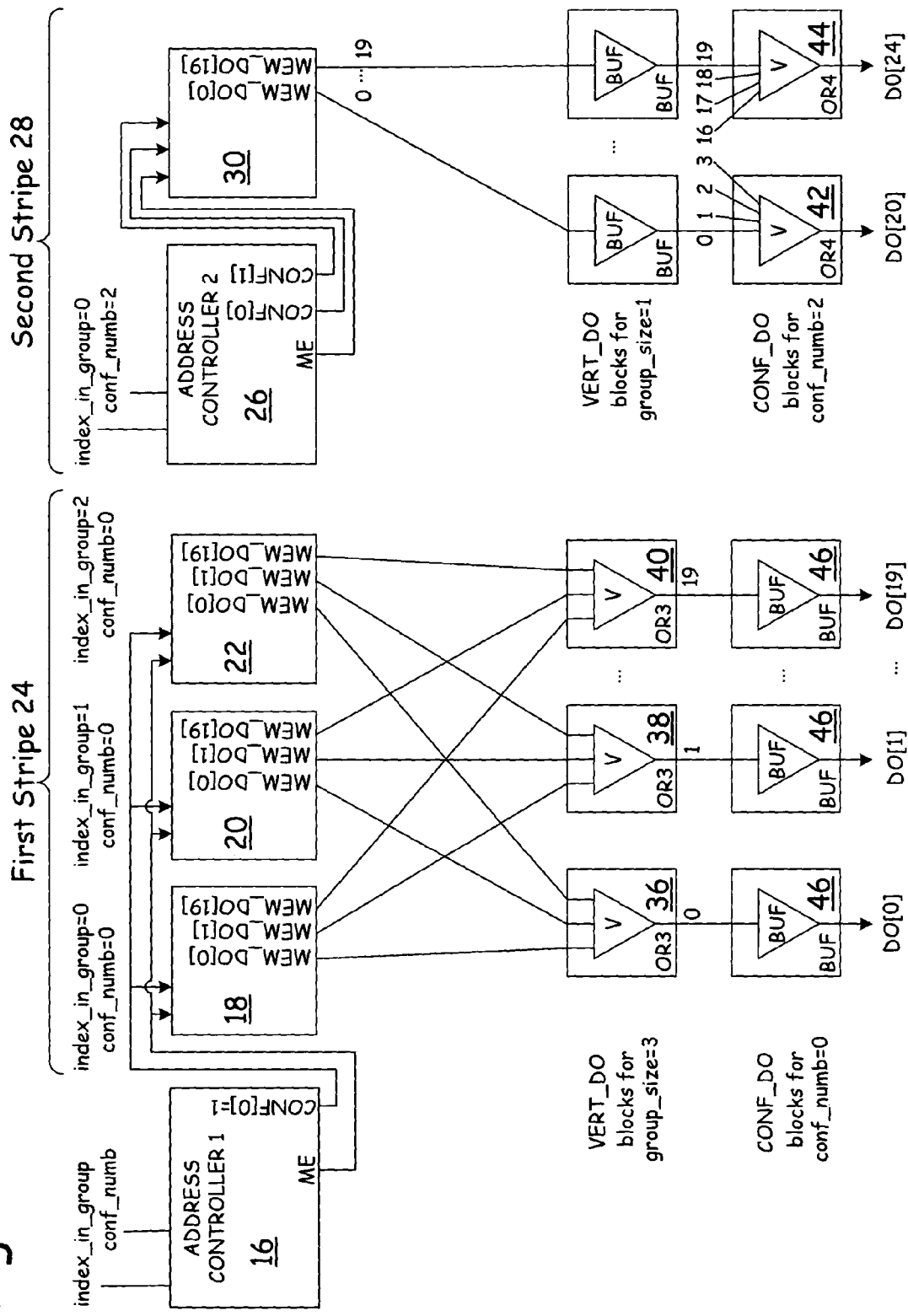
FIG. 3 is a schematic diagram of memory stripes for configured and non-configured memory tiles.

The foregoing procedure is illustrated by example in FIG. 3 for a customer memory 6K×25 with a capacity 6K and a total data width 25. The memory is divided into two stripes 24 and 28. Stripe 24 has a width of twenty and stripe 28 has a width of five. The first stripe 24 was tiled into three memory group tiles 18, 20, and 24 with no configuration (compression), i.e., conf_numb=0, and group_size=3. The second stripe 28 was tiled into one memory group tile with configuration (compression) of four times wherein conf_numb=2, and group_size=1.

In another example, the foregoing procedure may be use to configure a customer memory 64K×14 with a capacity 64K and a total data width of 14. As before, the memory is divided into two stripes (64K×10 and 64K×4). The first stripe representing 64K×10 has a width of ten and the second stripe has a width of four. The memory in each tile in the first stripe is 2K×20 hence the first stripe will contain sixteen tiles with a compression of two times (i.e., conf_numb=1, and group_size=16). As before the second stripe has a maximum width of five with a compression of four times. Hence, the second tile is tiled into a stripe containing eight groups with a width of four, not five, representing the remaining memory width, i.e. conf_numb=2, group_size=8.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of configuring a random access memory matrix, the method comprising the steps of:
   independently calculating a memory enable signal and a configuration signal for a partially configured memory in each memory tile of the memory matrix,
   determining memory tiles not supported by a memory compiler,
   providing memory wrapper for each tile not supported by the memory compiler,
   inserting an address controller in the memory matrix for each tile in a group of tiles,
   combining output signals from each memory location in a memory group having a common group index into a single output signal,
   selecting a first stripe of memory tiles containing first memory, the first stripe of memory tiles having a first width, and
   selecting a second stripe of memory tiles containing second memory, the second stripe of memory tiles having a second width.

2. The method of claim 1, wherein the first and second stripe of memory tiles contain from about one to about sixteen memory tiles.

3. The method of claim 1, wherein the first width is greater than zero and less than or equal to sixteen.

4. The method of claim 1, wherein the second width is equal to the total memory width minus the first width.

5. The method of claim 1, wherein the first memory comprises non-configured memory.

6. The method of claim 5, wherein the second memory comprises configured memory.

7. A tool for configuring RRAM memory containing partially configured memory, the tool comprising:
   a memory wrapper for a group of memories comprising a predetermined memory tile,
   an address controller for calculating a memory enable signal and a configuration signal for inputs to the partially configured memory,
   a vertical OR block for combining output signals from non-configured memories having a common index in a memory group into a single output signal, and
   a configured OR block for combining configured memory signals into a single signal for each configured memory output signal.

* * * * *